United States Patent
Fan et al.

(10) Patent No.: US 12,254,928 B2
(45) Date of Patent: Mar. 18, 2025

(54) OPERATION METHOD FOR MEMORY DEVICE

(71) Applicant: Winbond Electronics Corp., Taichung (TW)

(72) Inventors: Yi-Chen Fan, Hsinchu County (TW); Chieh-Yen Wang, Hsinchu County (TW)

(73) Assignee: Winbond Electronics Corp., Taichung (TW)

( * ) Notice: Subject to any disclaimer, the term of this patent is extended or adjusted under 35 U.S.C. 154(b) by 204 days.

(21) Appl. No.: 18/311,248

(22) Filed: May 3, 2023

(65) Prior Publication Data

US 2024/0282380 A1    Aug. 22, 2024

(30) Foreign Application Priority Data

Feb. 16, 2023   (TW) ................................. 112105503

(51) Int. Cl.
| | |
|---|---|
| *G11C 16/10* | (2006.01) |
| *G11C 16/16* | (2006.01) |
| *G11C 16/24* | (2006.01) |
| *G11C 16/34* | (2006.01) |

(52) U.S. Cl.
CPC ............ *G11C 16/102* (2013.01); *G11C 16/16* (2013.01); *G11C 16/24* (2013.01); *G11C 16/3459* (2013.01)

(58) Field of Classification Search
CPC ................................. G11C 16/16; G11C 16/24
See application file for complete search history.

(56) References Cited

U.S. PATENT DOCUMENTS

| | | | |
|---|---|---|---|
| 6,963,501 B2 | 11/2005 | Shiga | |
| 7,400,532 B2 | 7/2008 | Aritome | |
| 10,529,417 B2 | 1/2020 | Kanno | |
| 2007/0189073 A1* | 8/2007 | Aritome | ................ G11C 16/12 365/185.02 |
| 2012/0069666 A1* | 3/2012 | Fukuda | .............. G11C 16/3404 365/185.12 |
| 2013/0083600 A1 | 4/2013 | Lee | |
| 2020/0133574 A1* | 4/2020 | Lee | ..................... G06F 12/0246 |
| 2023/0326493 A1* | 10/2023 | Yang | ..................... G11C 7/1039 |
| 2023/0410913 A1* | 12/2023 | Sumi | ..................... G11C 16/08 |
| 2024/0194228 A1* | 6/2024 | Hung | ..................... G11C 16/30 |

* cited by examiner

*Primary Examiner* — Alexander Sofocleous
*Assistant Examiner* — Duy H Luong
(74) *Attorney, Agent, or Firm* — JCIPRNET

(57) ABSTRACT

An operation method for a memory device is provided. A memory block of the memory device includes an array of memory cells including cell strings and cell pages. Serially numbered and arranged bit lines are connected to the cell strings, respectively. Serially numbered and arranged word lines are connected to the cell pages, respectively. The operation method includes: performing a batch writing to each of the cell pages, such that the memory cells in each cell page are respectively grouped as an earlier written memory cell or a later written memory cell, depending on the connected bit line is either even-numbered or odd-numbered. Each cell page has a respective write sequence. In terms of write sequence, each cell page is identical with one of 2 nearest cell pages, and opposite to the other of the 2 nearest cell pages.

10 Claims, 3 Drawing Sheets

OPERATION METHOD FOR MEMORY DEVICE

CROSS-REFERENCE TO RELATED APPLICATION

This application claims the priority benefit of Taiwan application serial no. 112105503, filed on Feb. 16, 2023. The entirety of the above-mentioned patent application is hereby incorporated by reference herein and made a part of this specification.

BACKGROUND

Technical Field

The present disclosure relates to an operation method for a memory device, and particularly, to an operation method for a NAND flash memory device.

Description of Related Art

Flash memory is a non-volatile memory, and allows multiple cycles of writing, reading and erasing. Particularly, NAND type flash memory has an advantage of high storage density, and is comprehensively utilized in various high capacity memory products. As electronic industry has experienced phenomenal growth in recent decades, cell spacing in the NAND flash memory has been decreased continuously, so as to improve storage density. However, this leads to increase of interference between adjacent memory cells, and reliability of NAND flash memory is compromised.

SUMMARY

An operation method for a memory device is provided. A memory block of the memory device includes an array of memory cells including cell strings and cell pages. Serially numbered and arranged bit lines are connected to the cell strings, respectively. Serially numbered and arranged word lines are connected to the cell pages, respectively. The operation method includes: performing a batch writing to each of the cell pages, such that the memory cells in each cell page are respectively grouped as an earlier written memory cell or a later written memory cell, depending on the connected bit line is either even-numbered or odd-numbered. Each cell page has a respective write sequence. In terms of write sequence, each cell page is identical with one of 2 nearest cell pages, and opposite to the other of the 2 nearest cell pages.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
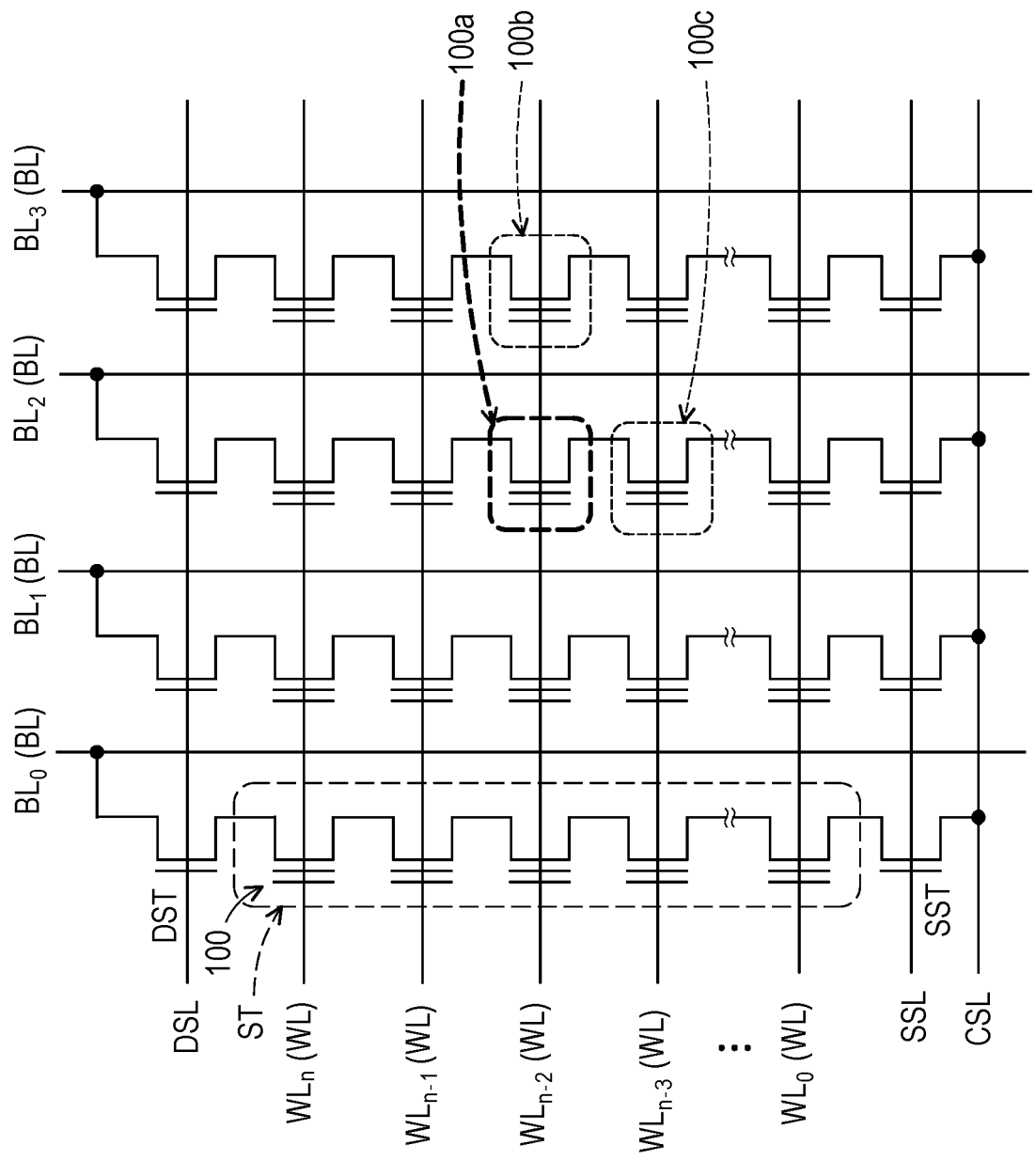
FIG. 1 is a circuit diagram illustrating a portion of a memory device according to some embodiments of the present disclosure.

FIG. 1 is a circuit diagram illustrating a portion of a memory device 10 according to some embodiments of the present disclosure. Referring to FIG. 1, the memory device 10 is a NAND flash memory device, and includes multiple memory banks. Each of the memory banks may include a plurality of memory blocks, which respectively include memory cells 100 arranged as an array. Some of the memory cells 100 in one of the memory blocks are shown in FIG. 1.

Each memory cell 100 may be a flash transistor, and includes a channel structure and a gate structure coupled to the channel structure. The gate structure may include a floating gate, a tunneling dielectric layer, a control gate and an inter-gate dielectric layer. During a write operation, the control gate receives a write voltage, to induce a carrier channel along the channel structure. In addition, this write voltage results in a sufficient electric field, such that carriers in the channel structure tunnel through the tunneling dielectric layer to enter the floating gate, and are captured in the floating gate. Accordingly, the memory cell 100 being written has a greater threshold voltage, and may store a logic data "0". In contrast, a memory cell 100 has not been written may be identified as storing a logic data "1".

During a read operation, the control gate receives a read voltage. The read voltage is preliminarily set, such that the written memory cell 100 can not be turned on by the read voltage, whereas the memory cell 100 has not been written can be turned on by the read voltage. By sensing a channel current of a selected memory cell 100, whether if the selected memory cell 100 is turned on can be identified. Accordingly, either the selected memory cell 100 stores the logic data "0" or the logic data "1" can be identified.

The memory cells 10 in each memory block of the memory device 10 are arranged along strings. The memory cells 100 in each cell string ST are serially connected. Specifically, the memory cells 100 in each cell string ST are connected with one another by the channel structures, and opposite ends of the connected channel structure are coupled to a bit line BL and a source line CSL via a drain select transistor DST and a source select transistor SST, respectively. The cell strings ST may be connected to respective bit lines BL. For instance, the bit lines BL may include bit lines $BL_0$ to $BL_3$. In addition, multiple ones of the cell strings ST may share the same source line CSL.

Further, the memory cells 100 in each cell string ST may be connected to respective word lines WL via the control gates. For instance, the word lines WL may include word lines $WL_0$ to $WL_n$. Moreover, the memory cells 100 from multiple ones of the cell strings ST and arranged along the same row may share the same word line WL. Similarly, the drain select transistors DST arranged along an additional row are connected to a drain select line DSL by gate terminals, and the source select transistors CST arranged along another additional row are connected to a source select line SSL by gate terminals.

Figure 2:
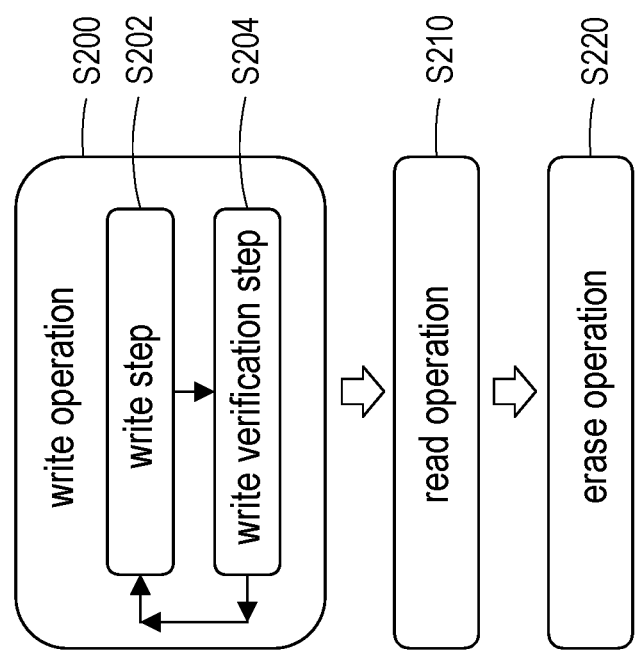
FIG. 2 is a flow diagram illustrating a method for operating the memory array, according to some embodiments of the present disclosure.

FIG. 2 is a flow diagram illustrating a method for operating the memory array 10, according to some embodiments of the present disclosure. Referring to FIG. 2, the operation method of the memory device 10 includes cycles each including a write operation S200, a read operation S210 and an erase operation S220. The write operation S200 may include multiple write steps S202. Multiple ones of the memory cells 100 connected along one of the word lines WL may be selected for writing during each of the write steps S202. Specifically, during each write step S202, a write voltage may be provided to a selected one of the word lines WL. In addition, multiple ones of the bit lines BL may be coupled to a bias voltage, to form a voltage difference between the selected bit lines BL and the source line CSL coupled to a reference voltage. By asserting the drain select line DSL and the source select line SSL to turn on the drain select transistor DST and the source select transistor SST, the channel structures of the cell strings ST intersecting the selected bit lines BL can be connected to the selected bit lines BL and the source line CSL by opposite ends, and a voltage difference is established at opposite ends of each of these channel structures. Accordingly, the memory cells 100 connected to the selected word lines WL, the selected bit lines BL and the source line CSL are turned on, and capture carriers to result in a relatively high threshold voltage.

Following each of the write steps S202, a write verification step S204 is performed, to verify if threshold voltages of the memory cells 100 being written during the latest write step S202 reach a pre-determined value. If the threshold voltages are higher than the pre-determined value, the latest write step S202 is identified as an effective write step, and the next write step S202 can be performed. On the other hand, if the threshold voltages do not reach the per-determined value, then the cycle including the latest write step S202 and the following write verification step S204 is repeated by increasing the write voltage, till the threshold voltages of the written memory cells 100 exceed the pre-determined value.

During each write verification step S204, a bias voltage is provided to the bit lines BL corresponding to the memory cells 100 being written in the latest write step S202, and the drain select transistors DST and the source select transistors SST are turned on by asserting the drain select line DSL and the source line CSL. Accordingly, the connected channel structures of the cell strings ST including the targeted memory cells 100 (i.e., the memory cells 100 being written in the latest write step S202) are coupled to the corresponding bit lines BL and the source line CSL, and a voltage difference is provided at opposite ends of each of these channel structures. In addition, a write verification voltage is provided to the word line WL connected to the targeted memory cells 100, and a pass voltage is provided to other word lines WL, to ensure that other memory cells 100 in these memory strings ST can be turned on. If the threshold voltages of the targeted memory cells 100 are greater than the write verification voltage, the targeted memory cells 100 would not be turned on, and very limited current can be sensed on the channel structures of these memory strings ST. In this case, the latest write step S202 is identified as effective, and the write operation S200 can proceed to the next write step S202. On the other hand, if the threshold voltages of the targeted memory cells 100 are lower than the write verification voltage, the targeted memory cells 100 would be turned on, and greater current can be sensed on the channel structures of these memory strings ST. In this case, the latest write step S202 is identified as ineffective, and the cycle consists of the latest write step S202 and the following write verification step S204 is repeated by increasing the write voltage, till the threshold voltages of the written memory cells 100 exceed the write verification voltage.

As the write operation S200 is completed, the read operation S210 may be performed. During each read operation S210, a plurality of the memory cells 100 connected to one of the word lines WL can be selected for reading. A method for reading the targeted memory cells 100 is similar to the method for performing write verification on selected memory cells 100. Specifically, in order to read the targeted memory cells 100, a bias voltage is provided to the bit lines BL corresponding to the targeted memory cells 100, and the drain select transistors DST and the source select transistors SST are turned on by asserting the drain select line DSL and the source line CSL. Accordingly, the connected channel structures of the cell strings ST including the targeted memory cells 100 are coupled to the corresponding bit lines BL and the source line CSL, and a voltage difference is provided at opposite ends of each of these channel structures. In addition, a read voltage is provided to the word line WL connected to the targeted memory cells 100, and a pass voltage is provided to other word lines WL, to ensure that other memory cells 100 in these memory strings ST can be turned on. If the threshold voltage of one of the targeted memory cells 100 is greater than the read voltage, this targeted memory cell 100 would not be turned on, and very limited current can be sensed on the channel structure of the corresponding memory string ST. In this case, it can be identified that this targeted memory cell 100 has been written and stores logic data "0". On the other hand, if the threshold voltage of one of the targeted memory cells 100 is lower than the write verification voltage, this targeted memory cell 100 would be turned on, and greater current can be sensed on the channel structure of the corresponding memory string ST. In this case, it can be identified that this targeted memory cell 100 is not written, and stores logic data "1".

Prior to the next write operation S200, the erase operation S220 is performed. Specifically, one of the memory blocks may be selected for each erase operation S200. As an example, the memory block including the memory cells 100 shown in FIG. 1 is targeted in an erase operation S220. In this example, all of the bit lines and the source line CSL are coupled to a ground voltage, and the drain select transistors DST as well as the source select transistors SST are turned on by asserting the drain select line DSL and the source select line SSL. Further, all of the word lines WL are coupled to an erase voltage opposite to the write voltage in terms of polarity. As a result, charges are removed from the floating gates of all of the memory cells 100. Accordingly, all of the memory cells 100 have a relative low threshold voltage, and represent logic data "1". After performing the erase operation S220, the erased memory block can be subjected to a next cycle of the write operation S200, the read operation S210 and the erase operation S220.

Further, each write step S202 in a write operation S200 is performed on a single page. That is, multiple ones of the memory cells 100 connected to a single word line WL are selected for writing in each write step S202. After all of the memory cells 100 in a page that are assigned to be written have been subjected to writing, the writing can proceed to next page. More particularly, multiple write steps S202 in a write operation S200 are performed on pages of the memory cells 100 by following arrangement sequence of the word lines WL. As an example, writing of the memory cells 100 connected to the word line $WL_n$ is followed by writing of the memory cells 100 connected to the word line $WL_{n-1}$. Thereafter, the memory cells 100 connected to the word line $WL_{n-2}$, the memory cells 100 connected to the word line $WL_{n-3}, \ldots$, and the memory cells 100 connected to the word line $WL_0$ are sequentially subjected to writing.

Moreover, batch writing is performed to the memory cells 100 connected to the same word line WL. Specifically, for the memory cells 100 connected to the same word line WL, the memory cells 100 connected to the even-numbered bit lines BL may be written at first, then the memory cells 100 connected to the odd-numbered bit lines BL may be written afterwards. Alternatively, for the memory cells 100 connected to the same word line WL, the memory cells 100 connected to the odd-numbered bit lines BL may be written at first, then the memory cells 100 connected to the even-numbered bit lines BL may be written afterwards.

According to the write sequence, one of adjacent pages of the memory cells 100 is subjected to writing before or after the other, and the memory cells 100 in the same page are written in groups. When spacing between adjacent memory cells 100 is very short, writing one of the memory cells 100 may affects other memory cells 100 arranged nearby.

The memory cells 100a, 100b are used for describing interference between the memory cells 100 in the same page. The memory cells 100a, 100b are connected to the same word line $WL_{n-2}$, but the memory cell 100a is connected to the bit line $BL_2$, while the memory cell 100b is connected to the bit line $BL_3$. Assumed that the even-numbered memory cells 100 in this page are subjected to an earlier write step, and the odd-numbered memory cells 100 in this page are subjected to a later write step. That is, the memory cell 100a may be written and verified before the write and the write verification of the memory cell 100b. Since the memory cells 100a, 100b are connected to the same word line $WL_{n-2}$, a threshold voltage of the memory cell 100a may be unintentionally raised when the memory cell 100b is subjected to writing, and vice versa. Nevertheless, since the steps of write and write verification of the memory cell 100b are later than the steps of write and write verification of the memory cell 100a, the threshold voltage sensed during write verification of the memory cell 100b would be a result of the writing of the memory cell 100b and the unintentional coupling during writing of the memory cell 100a, whereas the threshold voltage sensed during write verification of the memory cell 100a may not be resulted from the unintentional coupling during writing of the memory cell 100b. As a consequence, the threshold voltage sensed from the memory cell 100a during a later read operation may be higher than the threshold voltage sensed during write verification of the memory cell 100a, and the threshold voltage sensed from the memory cell 100b during a later read operation may be rather close to the threshold voltage sensed during write verification of the memory cell 100b. In other words, as compared to the memory cell 100b, the memory cell 100a would be resulted in a greater difference between the threshold voltage sensed during write verification and the threshold voltage sensed during reading.

In addition, the memory cells 100a, 100c are used for describing interference between the memory cells 100 in the same cell string ST. The memory cells 100a, 100c are both connected to the bit line $BL_2$, but the memory cell 100a is connected to the word line $WL_{n-2}$, whereas the memory cell 100c is connected to the word line $WL_{n-3}$. The memory cell 100a may be written and verified before the write and the write verification of the memory cell 100c. The threshold voltage of the memory cell 100c would be raised as a result of writing of the memory cell 100c, and a transconductance on the channel structure of the cell string ST corresponding to the memory cells 100c, 100c would be further lowered. As a consequence, channel current sensed during reading of the memory cell 100a would be lower than channel current sensed during write verification of the memory cell 100a. Equivalently, the threshold voltage sensed from the memory cell 100a during reading would be higher than the threshold voltage sensed from the memory cell 100a during write verification. On the other hand, the threshold voltage sensed from the memory cell 100c during reading may be rather close to the threshold voltage sensed from the memory cell 100c during write verification.

Therefore, for the memory cells 100 in the same cell string ST, the memory cells 100 written in a later write step (e.g., the memory cell 100c) may affect the memory cells 100 written in an earlier write step (e.g., the memory cell 100a). Further, as described, for the memory cells 100 in the same page, the memory cells 100 written in an earlier write step may have a greater threshold voltage variation, as compared to the memory cells 100 written in a later write step. For these reasons, in each page, the memory cells 100 being written in an earlier write step may also be referred to as high cross-coupling memory cells. As compared to a cell string ST having less high cross-coupling memory cells, a cell string ST with more high cross-coupling memory cells would be worse in terms of read disturb. Further, if an amount of the high cross-coupling memory cells greatly varies among the cell strings ST, the read disturb may be unevenly distributed, which may cause difficulties in reading. Moreover, the high cross-coupling memory cells may interfere with each other (further raising threshold voltage). Therefore, when each high cross-coupling memory cell is surrounded by more of other high cross-coupling memory cells, read disturb among the high cross-coupling memory cells becomes worse.

Figure 3:
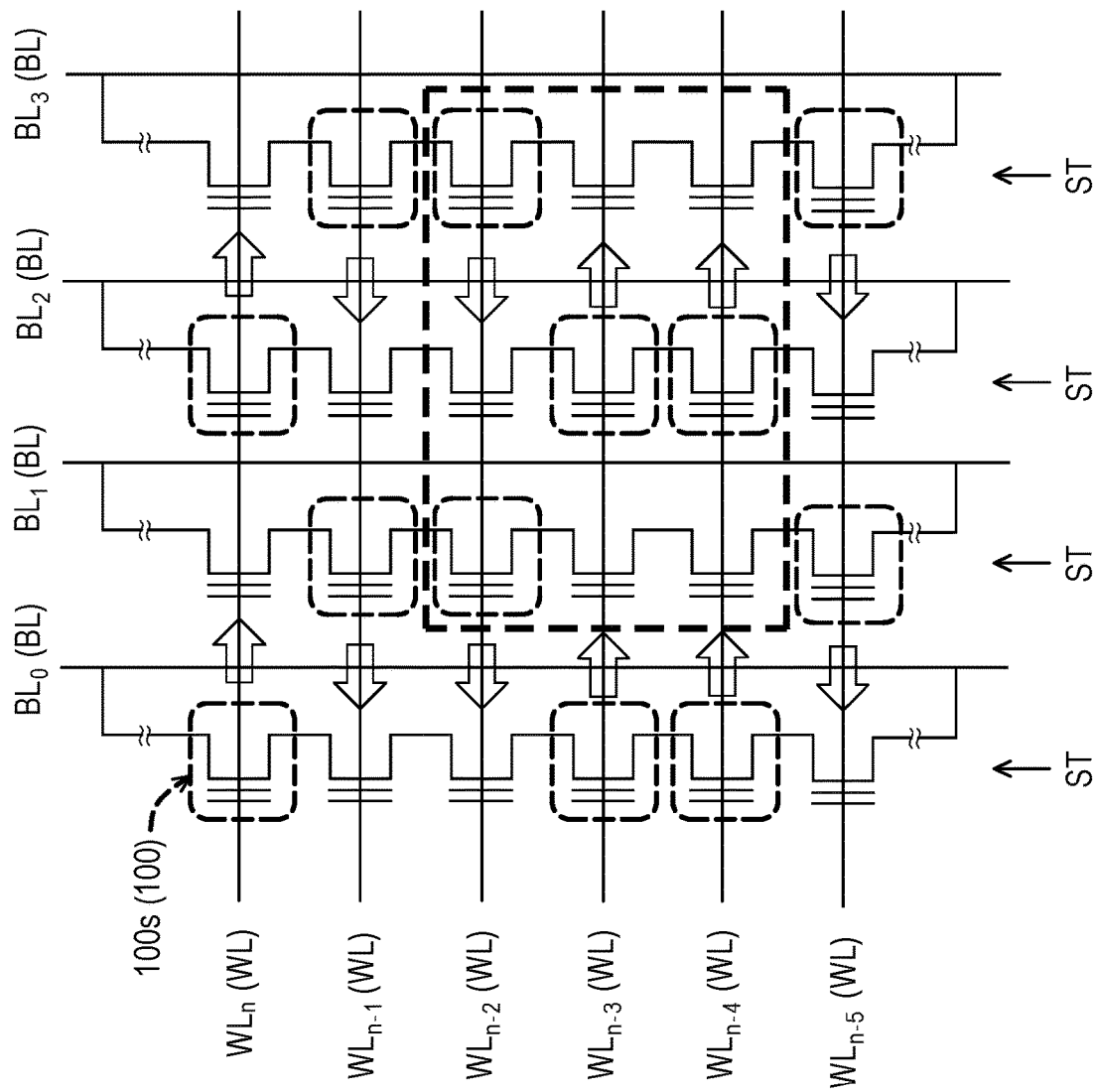
FIG. 3 is a schematic diagram illustrating a write sequence according to some embodiments of the present disclosure.

FIG. 3 is a schematic diagram illustrating a write sequence according to some embodiments of the present disclosure. It should be appreciated that, only a portion of the memory cells 100 in a memory block of the memory device 10 are used for illustrating the write sequence, and drain select transistors DST, source select transistors SST and the source line CSL connected to these memory cells 100 are omitted from illustration.

Referring to FIG. 3, each memory cell 100 in each page can be grouped as a memory cell 100 written in an earlier write step (also referred to as a high cross-coupling memory cell 100s) or a memory cell 100 written in a later write step, depending on either the connected bit line BL is odd-numbered or even-numbered. In terms of write sequence, each page of the memory cells 100 is identical with one of two adjacent pages of the memory cells 100, but opposite to the other. In this way, a pattern of the write sequences of sequentially arranged pages of the memory cells may include repetitive sub-patterns, each formed by the write sequences of four serially arranged pages of the memory cells 100.

For instance, for the memory cells 100 connected to the word line $WL_n$, the memory cells 100 connected to the even-numbered bit lines BL (e.g., including the bit lines $BL_0$, $BL_2$) are written in an earlier write step, and the memory cells 100 connected to the odd-numbered bit lines BL (e.g., including the bit lines $BL_1$, $BL_3$) are written in a later write step. As a result, the memory cells 100 connected to the word line $WL_n$ and the bit lines $BL_0$, $BL_2$ become two of the high cross-coupling memory cells 100s.

After the memory cells 100 connected to the word line $WL_n$ have been written, the memory cells 100 connected to the next word line $WL_{n-1}$ are subjected to batch writing. As a difference, for the memory cells 100 connected to the word line $WL_{n-1}$, the memory cells 100 connected to the odd-numbered bit lines BL are written in an earlier write step, and the memory cells 100 connected to the even-numbered bit lines BL are written in a later write step. As a result, the memory cells 100 connected to the word line $WL_{n-1}$ and the bit lines $BL_1$, $BL_3$ become two of the high cross-coupling memory cells 100s.

Thereafter, the memory cells 100 connected to the word line $WL_{n-2}$ are subjected to batch writing, by using the write sequence identical with the write sequence applied to the memory cells 100 connected to the word line $WL_{n-1}$. That is, for the memory cells 100 connected to the word line $WL_{n-2}$, the memory cells 100 connected to the odd-numbered bit lines BL are written in an earlier write step, and the memory cells 100 connected to the even-numbered bit lines BL are written in a later write step. As a result, the memory cells 100 connected to the word line $WL_{n-2}$ and the bit lines $BL_1$, $BL_3$ become two of the high cross-coupling memory cells 100s.

Subsequently, the memory cells 100 connected to the word line $WL_{n-3}$ are subjected to batch writing, by using the write sequence opposite to the write sequence applied to the memory cells 100 connected to the word line $WL_{n-2}$. That is, for the memory cells connected to the word line $WL_{n-3}$, the memory cells 100 connected to the even-numbered bit lines BL are written in an earlier write step, and the memory cells 100 connected to the odd-numbered bit lines BL are written in a later write step. As a result, the memory cells 100 connected to the word line $WL_{n-3}$ and the bit lines $BL_0$, $BL_2$ become two of the high cross-coupling memory cells 100s.

Up to here, four serially arranged pages connected to the word lines $WL_n$, $WL_{n-1}$, $WL_{n-2}$, $WL_{n-3}$ have been written. The write sequence applied to these four pages can be used for the next four pages of the memory cells 100 (including the page of the memory cells 100 connected to the word line $WL_{n-5}$). As repeating multiple times, all of the memory cells 100 (that are assigned to be written) in a memory block of the memory device 10 can be written. That is, a pattern of the write sequences for the four serially arranged pages of the memory cells 100 (according to numbering of the connected word lines WL) can be one of repetitive sub-patterns for writing the entire memory block.

The write sequence for a page of the memory cells 100 can be indicated by the distribution of the high cross-coupling memory cells 100s in this page. If the high cross-coupling memory cells 100s in a page of the memory cells 100 are the memory cells connected to the even-numbered bit lines BL, then the memory cells 100 connected to the even-numbered bit lines BL in this page are written in an earlier write step, and the memory cells 100 connected to the odd-numbered bit lines BL in this page are written in a later write step. On the other hand, if the high cross-coupling memory cells 100s in a page of the memory cells 100 are the memory cells connected to the odd-numbered bit lines BL, then the memory cells 100 connected to the odd-numbered bit lines BL in this page are written in an earlier write step, and the memory cells 100 connected to the even-numbered bit lines BL in this page are written in a later write step.

As shown in FIG. 3, in terms of distribution of the high cross-coupling memory cells 100s, each page of the memory cells 100 is identical with one of adjacent pages of the memory cells 100, but different from the other adjacent page of the memory cells 100. This indicates that each page of the memory cells 100 is identical in terms of write sequence with an adjacent page of the memory cells 100, but opposite in terms of write sequence with the other adjacent page of the memory cells 100. For instance, for the page of the memory cells 100 connected to the word line $WL_{n-2}$, the high cross-coupling memory cells 100s are the memory cells 100 connected to the odd-numbered bit lines BL (e.g., the bit lines $BL_1$, $BL_3$). The word line $WL_{n-2}$ is adjacent to and arranged between the word line $WL_{n-1}$ and the word line $WL_{n-3}$. For the memory cells 100 connected to the word line $WL_{n-1}$, the high cross-coupling memory cells 100s are the memory cells 100 connected to the odd-numbered bit lines BL (e.g., the bit lines $BL_1$, $BL_3$). On the other hand, for the memory cells 100 connected to the word line $WL_{n-3}$, the high cross-coupling memory cells 100s are the memory cells 100 connected to the even-numbered bit lines BL (e.g., the bit lines $BL_2$, $BL_4$). This shows that the page of the memory cells 100 connected to the word line $WL_{n-2}$ is identical in term of write sequence with the page of the memory cells 100 connected to the word line $WL_{n-1}$, but opposite in terms of write sequence with the page of the memory cells 100 connected to the word line $WL_{n-3}$. Such distribution of the high cross-coupling memory cells 100 and pattern of write sequences are also shown in pages of the memory cells 100 connected to other word lines WL.

By applying the pattern of write sequences, an amount of the high cross-coupling memory cells 100s in each cell string ST is close to an amount of the high cross-coupling memory cells 100s in each of other cell strings ST. Specifically, a difference between an amount of the high cross-coupling memory cells 100s in each cell string ST and an amount of the high cross-coupling memory cells 100s in each of other cell strings ST is no greater than 1. As an example shown in FIG. 3, each of the four cell strings ST connected to the bit lines $BL_0$, $BL_1$, $BL_2$, $BL_3$ includes 3 high cross-coupling memory cells 100s. In other examples that an amount of the cell pages is an odd number, a difference between an amount of the high cross-coupling memory cells 100s in each cell string ST and an amount of the high cross-coupling memory cells 100s in each of other cell strings ST could be 1. As a result of such distribution of the high cross-coupling memory cells 100s, read disturb may be prevented from being concentrated in certain cell strings ST. Therefore, the memory cells 100 in each of the cell strings ST can be read out with higher accuracy.

Moreover, as compared to setting each cell page opposite in terms of write sequence to both of adjacent cell pages, using the write sequences according to embodiments of the present disclosure for performing writing on the memory device 10 may result that each high cross-coupling memory cell 100s is surrounded by fewer of other high cross-coupling memory cells 100s. Accordingly, interference between the high cross-coupling memory cells 100s can be effectively reduced. Specifically, setting each cell page opposite in terms of write sequence to both of adjacent cell pages would result in each high cross-coupling memory cell surrounded by 4 nearest high cross-coupling memory cells. In contrast, using the write sequences according to embodiments of the present disclosure for performing writing on the memory device 10 may result that each high cross-coupling memory cell 100s is surrounded by only 3 nearest high cross-coupling memory cells 100s. For instance, as indicated by the region enclosed by a dashed line in FIG. 3, the high cross-coupling memory cell 100s connected to the word line $WL_{n-3}$ and the bit line $BL_2$ is surrounded by 3 high cross-coupling memory cells 100s, including 2 high cross-coupling memory cells 100s connected to the word line $WL_{n-2}$ and the bit lines $BL_1$, $BL_3$ and 1 high cross-coupling memory cell 100s connected to the word line $WL_{n-4}$ and the bit line $BL_2$. Each of other high cross-coupling memory cells 100s is also surrounded by 3 nearest high cross-coupling memory cells 100s.

As above, an operation method for a memory device is provided. The operation method includes performing write sequences to each memory block of the memory device. Each memory block of the memory device includes memory cells arranged in an array. Bit lines serially arranged and numbered are respectively connected to a cell string, and word lines serially arranged and numbered are respectively connected to a page of the memory cells. Each memory cells in each page can be grouped as a memory cell written in an earlier write step or a memory cell written in a later write step, depending on either the connected bit line is even-numbered or odd-numbered. As the write steps for writing a page of the memory cells (e.g., the page of the memory cells 100 connected to the word line $WL_n$) are completed, cell writing proceeds to the next page of the memory cells (e.g., the page of the memory cells 100 connected to the word line $WL_{n-1}$). In addition, each cell page is identical in terms of write sequence (indicating either the memory cells connected to the even-numbered bit lines or the memory cells connected to the odd-numbered bit lines are written in an earlier write step) with one of nearest two cell pages, but opposite in terms of write sequence with the other of the nearest two cell pages. In this way, the memory cells being written before the others in the same page are evenly distributed among the cell strings, thus read disturb can be avoided from being concentrated in certain cell strings. Further, as compared to setting each cell page opposite in terms of write sequence to both of adjacent cell pages, using the write sequences according to embodiments of the present disclosure may result that each of the memory cells being written before the others in each cell page is surrounded by fewer of other memory cells being written before the others in the same page. Accordingly, interference between the memory cells being written before the others in the same page can be effectively reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An operation method for a memory device, wherein a memory block of the memory device comprises an array of memory cells including cell strings and cell pages, serially numbered and arranged bit lines are connected to the cell strings respectively, serially numbered and arranged word lines are connected to the cell pages respectively, and the operation method comprises:
    performing a batch writing to each of the cell pages, such that the memory cells in each cell page are respectively grouped as an earlier written memory cell or a later written memory cell, depending on the connected bit line is either even-numbered or odd-numbered, wherein each cell page has a respective write sequence, each cell page is identical in terms of write sequence with one of 2 nearest cell pages, and opposite in terms of write sequence to the other of the 2 nearest cell pages.

2. The operation method for the memory device according to claim 1, wherein each earlier written memory cell is surrounded by 8 nearest memory cells, and an amount of others of the earlier written memory cells in the 8 nearest memory cells is 3.

3. The operation method for the memory device according to claim 1, wherein a difference between an amount of the earlier written memory cells in each cell string and an amount of the earlier written memory cells in each of other cell strings is no more than 1.

4. The operation method for the memory device according to claim 3, wherein each cell string is identical with other cell strings, in terms of the amount of the earlier written memory cells.

5. The operation method for the memory device according to claim 1, wherein the cell pages are sequentially arranged according to numbering of the connected word lines, and every 4 sequentially arranged ones of the cell pages have identical distribution of the earlier written memory cells.

6. The operation method for the memory device according to claim 1, wherein performing the batch writing to each cell page comprises: performing the batch writing to a first cell page, a second cell page, a third cell page and a fourth cell page connected to 4 serially arranged ones of the word lines, wherein the first cell page is identical in terms of write sequence with the fourth cell page, but opposite in terms of write sequence to the second cell page and the third cell page.

7. The operation method for the memory device according to claim 1, wherein the array of the memory cells is an array of NAND type flash transistors.

8. The operation method for the memory device according to claim 1, wherein after a group of the memory cells in each cell page is subjected to writing, the operation method further comprises:
    performing a write verification to the group of the memory cells, to sense threshold voltages of the group of the memory cells, and to compare the threshold voltages with a pre-determined value.

9. The operation method for the memory device according to claim 1, wherein after the cell pages are written, the operation method further comprises:
    selecting at least one of the memory cells in one of the cell pages for reading.

10. The operation method for the memory device according to claim 1, further comprising:
    performing data erasing to the cell pages in the memory block.

\* \* \* \* \*